April 25, 1961 G. L. TUCKER 2,981,645

SEMICONDUCTOR DEVICE FABRICATION

Filed Sept. 4, 1956

*INVENTOR.*
GARDINER L. TUCKER

*BY*

Alvin J. Riddles
AGENT 2,981,645
Patented Apr. 25, 1961

2,981,645

SEMICONDUCTOR DEVICE FABRICATION

Gardiner L. Tucker, Glenham, N.Y., assignor to International Business Machines Corporation, New York, N.Y., a corporation of New York Filed Sept. 4, 1956, Ser. No. 607,781

3 Claims. (Cl. 148—1.5)

This invention relates to semiconductor devices and in particular to a method of providing semiconductor device bodies having a desired variation of resistivity.

In semiconductor materials such as germanium and silicon the electrical properties are determined by the predominance and concentration of trace quantities of significant impurities. A certain class of these impurities for example, arsenic and antimony provide N type conductivity to the material and another class of which indium and gallium are members provide P type conductivity. The predominance of one conductivity type directing impurity over the others determines the conductivity type of the semiconductor material and the net quantity of the particular type predominating determines the resistivity ($\rho$) of the semiconductor material.

It has become established in the art that the performance of a semiconductor device and the specifications for the conditions under which it is to operate are influenced both by the value of the resistivity of the semiconductor material at certain points within a region of a particular conductivity type and by the rate of change of resistivity from one point to another in the region. An example of a semiconductor device illustrating the importance of a particular resistivity at certain points and a rate of change of resistivity between points is shown in U.S. Patent 2,810,870.

The technique of diffusion of impurities into semiconductor material has been found to be one method of providing a difference of resistivity between two points in a semiconductor crystal. When this technique is employed, due to the nature of the diffusion operation, there is generally a high concentration of impurity at the surface of the semiconductor material through which the impurity entered. The high impurity concentration results in a resistivity of the semiconductor material that is so low that the performance of the device is affected. To improve this situation, steps must be taken to increase the resistivity at the surface of the semiconductor material. One method currently used in the art to overcome this problem has been to remove the low resistivity material from the semiconductor crystal by abrading or etching. Both abrading and etching are technologically difficult to accomplish and in either case the semiconductor crystal then requires a conditioning step to remove the adverse effects of the abrading or etching.

According to the method of this invention the resistivity at the surface of a quantity of semiconductor material may be increased by a diffusion operation conducted in an environment containing an impurity concentration that is lower than the concentration of the impurity necessary to produce the impurity concentration in the semiconductor material at the surface of the material. At the same time such a diffusion operation produces an impurity distribution in the region of the semiconductor material immediately adjacent to the surface that is optimum for the fabrication of certain devices.

A primary object of this invention is to provide a method of increasing the resistivity at the surface of semiconductor material. Another object of this invention is to provide a method of providing a region of known, substantially constant, resistivity to a desired depth in a quantity of semiconductor material having a resistivity gradient.

Other objects of the invention will be pointed out in the following description and claims and illustrated in the accompanying drawings, which disclose, by way of example, the principle of the invention and the best mode, which has been contemplated, of applying that principle.

Figure 1:
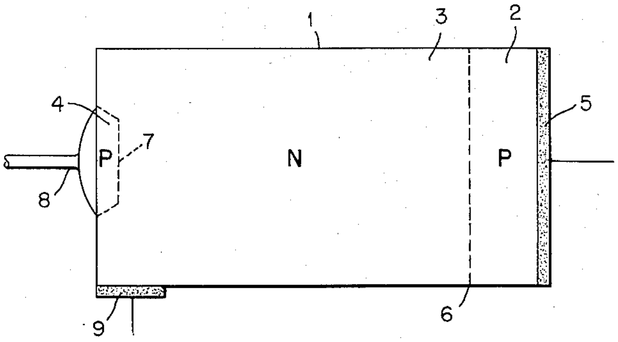
Figure 1 is a schematic diagram of a semiconductor device body.

Referring now to Figure 1, there is shown a junction transistor 1 comprising a body of semiconductor material for example of germanium or silicon containing significant impurities. The body of transistor 1 contains three zones of alternately opposite conductivity, namely zones 2, 3 and 4 arbitrarily shown as P, N and P type conductivity respectively. An ohmic contact 5 is made for example by soldering to the surface of the P type zone 2. Zones 2 and 3 form a P-N junction 6 which serves as the collector junction of the transistor 1. Zones 3 and 4 form a P-N junction 7 which serves as the emitter junction of the transistor. An ohmic connection 8 is made to the emitter zone 4 and another ohmic connection 9 is made to the zone 3 which serves as the base of the transistor 1. In forming semiconductor devices such as the structure of Figure 1 it is often desirable to provide a difference in resistivity within the body of the device. One of the more easily practiced methods of providing this difference in resistivity is to introduce a quantity of significant impurity into the semiconductor material by the technique of diffusion. In this technique a source of the desired impurity is presented to the surface of the material under conditions such that the diffusion rate of the impurity into the crystal is appreciable. There are two types of diffusion practiced at the present state of the art, these are known as diffusion in which the impurity is presented in the solid state and diffusion in which the impurity is presented in the gaseous state. In solid state diffusion a solid quantity of impurity material is deposited on the surface of the semiconductor crystal and the temperature is then raised to accelerate the diffusion. One method of accomplishing this type of diffusion is described in Patent No. 2,695,852. In gaseous diffusion, the impurity is diffused into the semiconductor material from a vapor state which serves as a constant source. One method of performing this type of diffusion is described in copending application No. 589,953, filed June 6, 1956, now abandoned, and assigned to the assignee of this application.

When the impurity diffuses into the semiconductor material the distribution of the impurity is such that there is a large concentration at the surface and progressively lesser quantities at greater distances within the material. Since the resistivity of the material for a particular conductivity varies approximately inversely with the quantity of impurity present, the resistivity will be low at the surface and progressively higher within the material. A graph showing the variation of resistivity of the semiconductor with depth as a result of a typical diffusion operation is shown in Figure 2.

Figure 2:
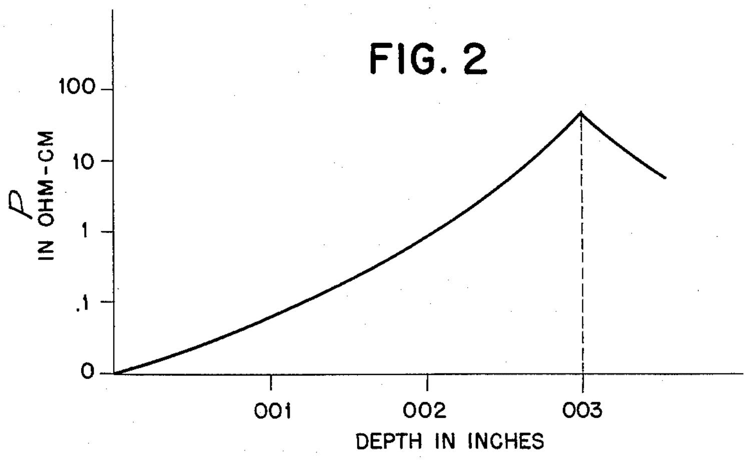
Figure 2 is a graph showing the variation of resistivity with depth in a semi-conductor crystal as a result of a diffusion operation.

Referring now to Figure 2 the curve is shown having a resistivity value approaching zero at the surface, rising approximately exponentially with depth to a simple cusp and then decreasing approximately exponentially to a value representing the resistivity of the sample before the diffusion operation. At the point of tangency of the arcs of the resistivity curve at the cusp, the semiconductor material is nearly intrinsic and a P-N junction is close to this cusp. The low resistivity of the semiconductor material at the surface produces undesirable effects for example a low reverse breakdown voltage of a rectifying contact such as zone 4 in Figure 1, made to the surface.

To remedy this situation in accordance with this invention, the semiconductor material is subjected to a second diffusion operation wherein the environment contains a concentration of impurity lower than that necessary to produce the impurity concentration present in the material at the surface of the material. When this is done the impurity diffuses into the environment, thereby sharply lowering the concentration of the impurity at the surface. Since the speed of the diffusion operation is dependent upon the temperature and the concentration of the impurity, it has been found that the operation can be performed in the minimum time where the highest permissible temperature is used and where the concentration of the impurity in the environment is at a minimum. The use of a vacuum or an inert or reducing atmosphere has been found to provide an satisfactory environment for this operation. The highest permissible temperature in a particular case would be that which would do thermal damage to the semiconductor material. This is generally near the melting point. The diffusion operation causes the impurity to migrate both further into the semiconductor material and away from the surface, however, it has been found that the migration into the material has a small effect on the resistivity curve within the material whereas the migration causes the resistivity to rise sharply at the crystal surface. It should be noted that where solid state diffusion has been used to produce the initial resistivity gradient, the source of impurity, even though microinches in thickness, is best removed before the diffusion operation of this invention is employed in order to accelerate the operation. In the case of gaseous diffusion, a mere change of environment such as exhausting the impurity vapor, provides acceptable conditions.

Figure 3:
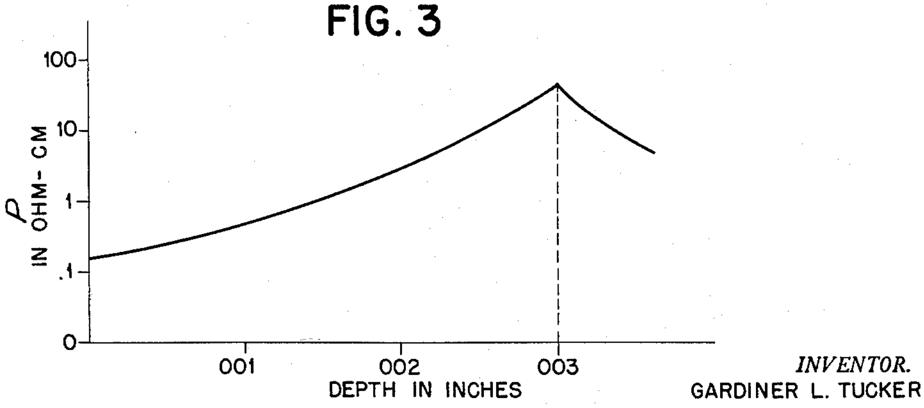
Figure 3 is a graph showing the change in resistivity at the surface as a result of the diffusion step of this invention.

Referring now to Figure 3, the resistivity curve as a result of the diffusion operation of this invention, has levelled off in the vicinity of the surface and has risen to a finite value. As a result, it is now possible to apply rectifying contacts such as points or alloy junctions to this surface and these contacts will have acceptable reverse breakdown voltages. In addition to this, several not immediately apparent advantages are realized by the diffusion operation of this invention. A first of these is that reverse breakdown voltages of a specific value may be achieved for a rectifying contact. It is established in the art that the reverse breakdown voltage of a rectifying contact is affected by the resistivity of the semiconductor material immediately adjacent to the point at which the contact is made. As a result of the precise control that may be realized in a diffusion operation, due to the slow rate at which it takes place, very closely predictable surface resistivities are possible through this invention. Another valuable advantage gained through the use of the diffusion operation of this invention is that the injection efficiency of a rectifying contact used as an emitter is constant over the entire surface of contact with the semiconductor material. This injection efficiency, known in the art as gamma ($\gamma$), affects many of the performance parameters of a semiconductor device using an injecting rectifying contact and is affected by the resistivity of the region of the semiconductor material immediately adjacent to the contact. Still another valuable advantage results from the fact that a low surface conductivity may greatly reduce surface leakage currents which would be detrimental to semiconductor device performance.

Considering as an illustration, the transistor in Figure 1, the emitter region 4 forming the junction 7 with the base region 3 penetrates to varying depths so that were the resistivity of the base region to vary as shown in Figure 2 there would be a variation resistivity over the surface of the junction 7 and hence a variation in $\gamma$. With the method of this invention however, the resistivity curve levels off in the portion of the material near the surface as shown in Figure 3. Under these conditions when a rectifying contact such as might be made for example by the alloy junction techniques known in the art is applied as shown by region 4 and junction 7 in Figure 1, the resistivity of the region 3 being constant to a depth indicated by Figure 3 will be constant over the surface of the junction 7.

When a vacuum is selected as the environment for the resistivity raising diffusion operation of this invention at temperatures near the melting point of the semiconductor material a very shap rise in surface resistivity takes place in a matter of a few seconds, but curve leveling to appreciable depths requires considerably longer. As an indication of order of magnitude for a given set of conditions about one-fifth of the time required to diffuse an impurity into a semiconductor sample to a specific depth will raise the resistivity at the surface and to a depth adequate for most alloy junctions. Other types of contacts such as plated and point contacts may require considerably less time.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. The process of providing a graded resistivity semiconductor body having a known substantially constant resistivity to a specific depth at the surface thereof comprising in combination the steps of heating for a given time a semiconductor body in the presence of a vapor containing a concentration of a significant impurity and heating said body for a lesser period of time in a vacuum.

2. A method of making a transistor comprising the steps of diffusing a quantity of a particular conductivity type determining impurity into a semiconductor crystal body of an opposite conductivity type in a concentration and for a time sufficient to form a region of opposite conductivity type in said body, heating said body in an environment containing a lower concentration of said particular conductivity than the concentration of said conductivity determining impurity at the surface of said body for a time sufficient to increase the resistivity of said body in the region adjacent to the surface thereof, exposing the original conductivity type region of said body, applying an ohmic contact to each of said original conductivity type and said opposite conductivity type regions, and forming an alloyed rectifying connection in said increased resistivity region of the surface of said semiconductor body.

3. A method of providing a semiconductor device body comprising the steps of diffusing a conductivity type determining impurity into a crystal of semiconductor material to a predetermined depth, and subjecting said material to heat in an environment having a lower concentration of said conductivity type determining impurity than the concentration of said conductivity type determining impurity at the surface of said semiconductor material for a time sufficient to increase the resistivity of said semiconductor material in the region adjacent the surface thereof.

References Cited in the file of this patent

UNITED STATES PATENTS

| | | |
|---|---|---|
| 2,658,844 | Harbaugh | Nov. 10, 1953 |
| 2,725,315 | Fuller | Nov. 29, 1955 |
| 2,784,121 | Fuller | Mar. 5, 1957 |
| 2,810,870 | Hunter et al. | Oct. 22, 1957 |
| 2,822,310 | Stieltjes et al. | Feb. 4, 1958 |
| 2,845,374 | Jones | July 29, 1958 |
| 2,879,188 | Strull | Mar. 5, 1959 |